United States Patent [19]

Asazawa

[11] Patent Number: 5,119,095
[45] Date of Patent: Jun. 2, 1992

[54] D/A CONVERTER FOR MINIMIZING NONLINEAR ERROR

[75] Inventor: Hiroshi Asazawa, Tokyo, Japan
[73] Assignee: NEC Corporation, Japan
[21] Appl. No.: 372,710
[22] Filed: Jun. 28, 1989
[30] Foreign Application Priority Data Jun. 29, 1988 [JP] Japan .............................. 63-164013

[51] Int. Cl.⁵ .......................................... H03M 1/78
[52] U.S. Cl. .................................. 341/154; 341/118
[58] Field of Search ................ 341/118, 144, 153, 154

[56] References Cited

U.S. PATENT DOCUMENTS

| | | | |
|---|---|---|---|
| 4,381,499 | 4/1983 | Struthoff | 341/154 |
| 4,551,709 | 11/1985 | Merchant et al. | 341/118 |
| 4,631,522 | 12/1986 | Cabot | 341/118 |
| 4,803,461 | 2/1989 | Yamaguchi et al. | 341/154 |
| 4,843,394 | 6/1989 | Linz et al. | 341/154 |

OTHER PUBLICATIONS

Kamoto et al., "An 8-bit 2-ns Monolithic DAC", IEEE Journal of Solid-State Circuits, vol. 23, No. 1, Feb. 1988.
Schouwenaars et al., "A Low-Power Stereo 16-bit CMOS D/A Converter for Digital Audio", IEEE Journal of Solid-State Circuits, vol. 23, No. 6, Dec. 1988.
Watanabe et al., "A 400-MHz DA Converter with a 4-bit Color Map for 2000-Line Display", IEEE Journal of Solid-State Circuits, vol. 23, No. 1, Feb. 1988.
Miki et al., "An 80-MHz 8-bit CMOS D/A Converter", IEEE Journal of Solid-State Circuits, vol. sc-21, No. 6, Dec. 1986.
Maio et al., "A 500-MHz 8-Bit D/A Converter", IEEE Journal of Solid-State Circuits, vol. sc-20, No. 6, Dec. 1985.

Primary Examiner—A. D. Pellinen
Assistant Examiner—Marc S. Hoff
Attorney, Agent, or Firm—Leydig, Voit & Mayer

[57] ABSTRACT

A D/A converter includes a first resistor group connected between first and second reference potentials, a second resistor group consisting of resistors, first terminals of which are respectively connected between the first reference potential and a first node of a first resistor and other nodes in the first resistor group, an operational amplifier, first switching elements consisting of semiconductor elements each having an input electrode and two output electrodes, one of the output electrodes being connected to each second terminal in the second resistor group, and the other output electrode being connected to the non-inverting input terminal of the amplifier, second switching elements each consisting of a semiconductor element having an input electrode and two output electrodes, one of the output electrodes being connected to each second terminal in the second resistor group, and the other output electrode being connected to the inverting input terminal of the amplifier, and a drive circuit. Resistances of the first and second resistor groups which are in downstream of the first node are set to be equal to each other. The resistances of the first and second resistor groups are determined so that a first composite resistance when viewed to the first resistor group from the nodes including the first node is equal to a second composite resistance when viewed to the second resistor group.

11 Claims, 11 Drawing Sheets

FIG. 11

D/A CONVERTER FOR MINIMIZING NONLINEAR ERROR

BACKGROUND OF THE INVENTION

The present invention relates to a D/A converter using resistors and switches and, more particularly, to a circuit arrangement for minimizing a nonlinear error of a D/A converter which is caused by an ON resistance of a switch.

Figure 1:
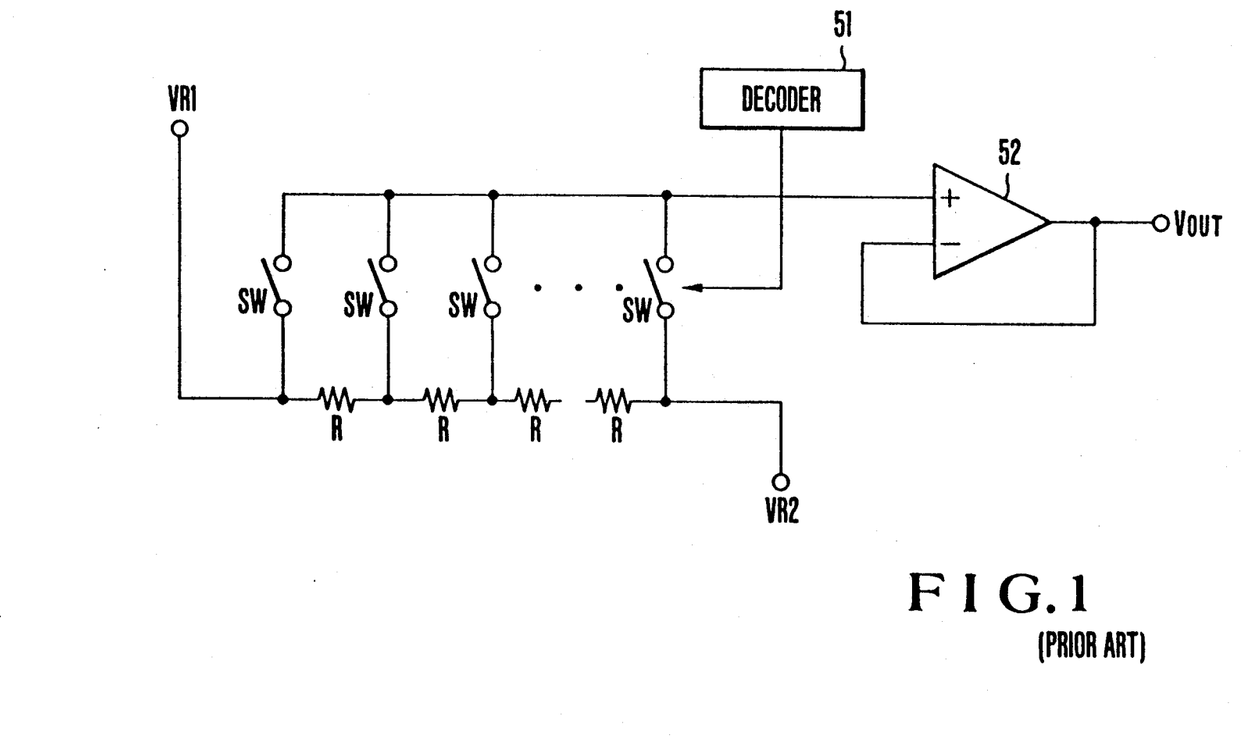
FIG. 1 is a circuit diagram showing a conventional D/A converter.

In a conventional D/A converter of this type using resistors and switches, as shown in FIG. 1, first and second reference voltages VR1 and VR2 are divided by n resistors R. One of (n+1) switches SW connected to each dividing point is turned on by a decoder 51 for converting an input digital signal into a switch drive signal, so that a voltage corresponding to the input digital signal is output from an operational amplifier 52 as an output $V_{OUT}$.

Figure 2:
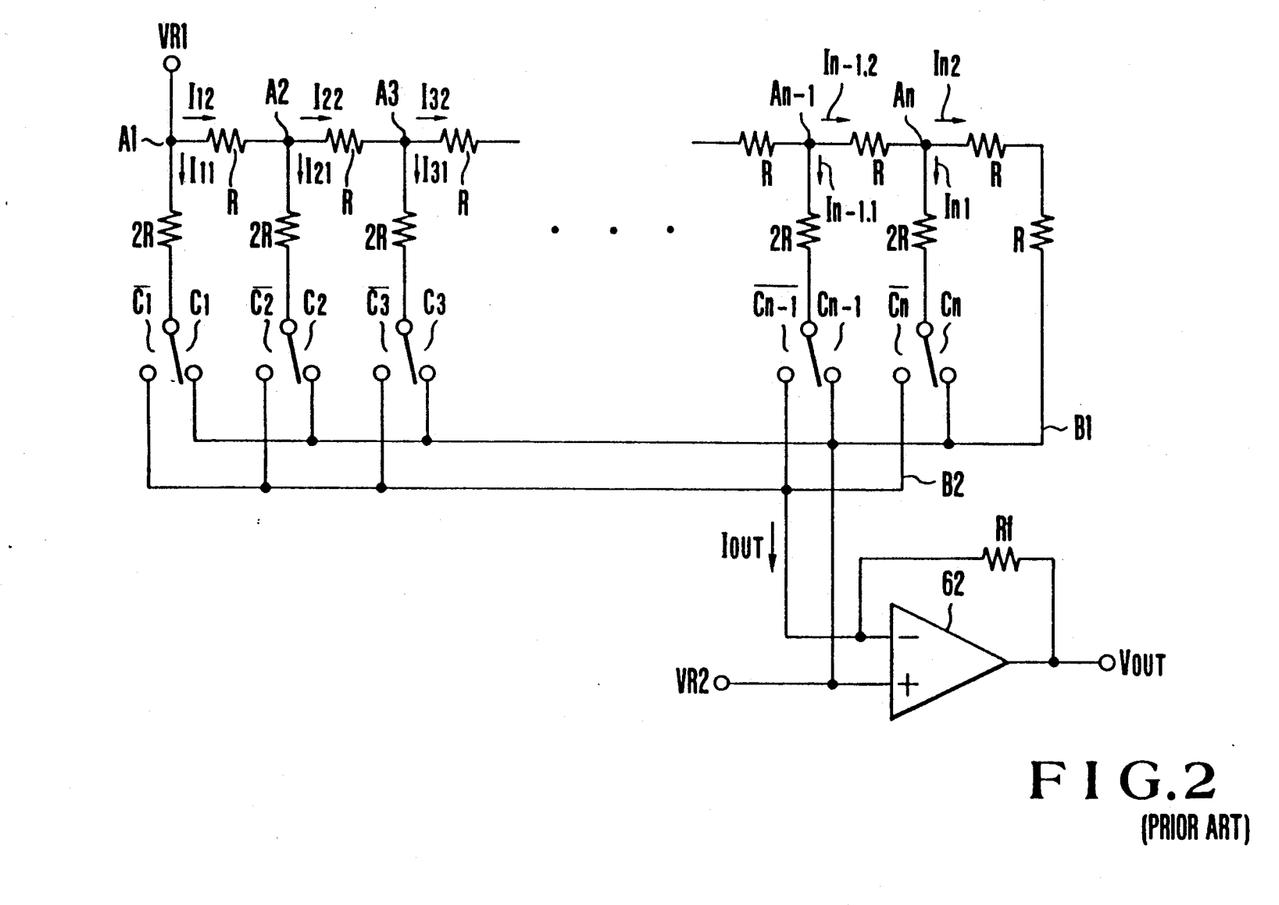
FIG. 2 is a circuit diagram showing another conventional D/A converter.

Another conventional circuit arrangement is shown in FIG. 2. This D/A converter includes a resistor ladder consisting of resistors R each having a resistance R and resistors 2R each having a resistance 2R, and dual switches 1, 2, ..., n respectively consisting of switches C1, $\overline{C_1}$, ..., $C_n$, $\overline{C_n}$. One output electrode of each dual switch is connected to an inverting input terminal (−) of an operational amplifier 62, and the other electrode is connected to the reference voltage VR2 and a non inverting input terminal (+) of the operational amplifier 62. On the other hand, the operational amplifier 62 has a circuit arrangement subjected to resistor feedback by a feedback resistor Rf to convert a current IOUT into a voltage. Signal lines B1 and B2 connected to the input terminals of the operational amplifier 62 are virtually grounded to have potentials equal to the reference voltage VR2. Assume that an ON resistance of the dual switch can be disregarded. Even if the dual switch is connected to one of the two contacts, a resistance is 2R when viewed to the right and in the lower direction with reference to a node An Therefore, $I_{n1}=I_{n2}$. When simultaneously viewed to the right and in the lower direction from the node An, its composite resistance is R. When viewed from a node $A_{n-1}$, a resistance is 2R. Therefore, $I_{n-1,1}=I_{n-2,2}$.

Similarly, the above result can be obtained in all nodes $A_1, A_2, \ldots, A_n$. Therefore, a current is weighted to ½ in the nodes $A_1, A_2, \ldots, A_n$, in the order named, and $2^n$ combinations can be obtained as the output current $I_{OUT}$.

In the above-mentioned conventional D/A converter shown in FIG. 1, however, since a current is not supplied to the switches SW, the ON resistance of the switches can be disregarded. However, the n resistors and (n+1) switches are required in order to perform D/A conversion in (n+1) steps, thus undesirably increasing the number of elements constituting the circuit.

The conventional D/A converter shown in FIG. 2 can perform D/A conversion in $2^n$ steps by the n dual switches. However, when each dual switch consists of MOS transistors, unbalance occurs due to its ON resistance, thus causing nonlinearity of the D/A conversion characteristics.

Figure 3:
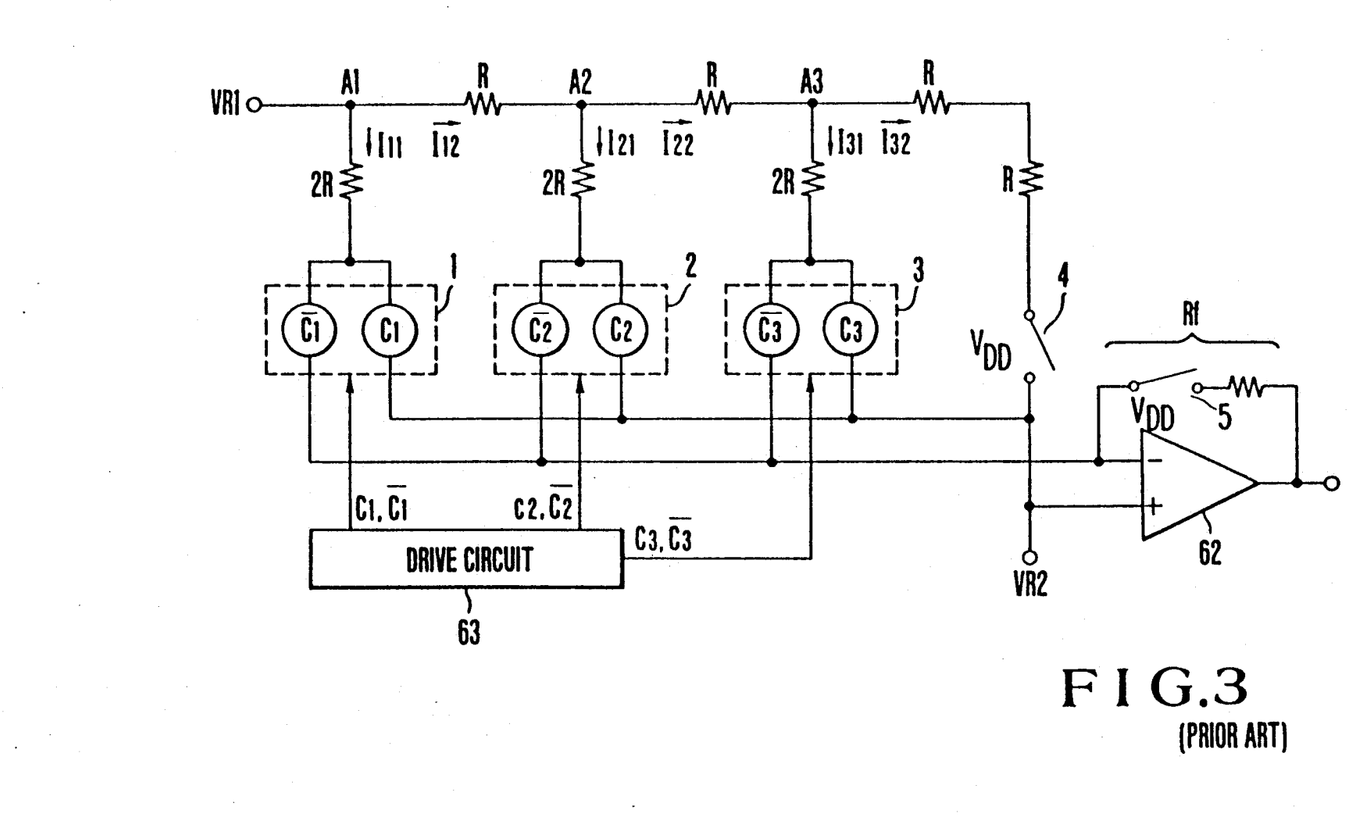
FIG. 3 is a circuit diagram showing a detailed arrangement of a conventional 3-bit D/A converter.

For the sake of descriptive simplicity, a 3-bit D/A converter shown in FIG. 3 is exemplified. The same reference numerals in FIG. 3 denote the same parts as in FIG. 2. Reference numeral 63 denotes a drive circuit for driving the dual switches 1 to 3.

In order to minimize the influences of the ON resistances of the three dual switches 1, 2, and 3, normally ON switches 4 and 5 which have ON resistances equal to those of the three dual switches 1, 2, and 3 are connected in series with the resistor R to the right of the node $A_3$ and with the feedback resistor Rf of the operational amplifier 62 as dummy switches, respectively.

More specifically, assuming that the ON resistance of each dual switch is r, resistances when viewed to the right and in the lower direction from the node $A_3$ are $(2R+r)$. Therefore, $I_{31}=I_{32}$.

A composite resistance when simultaneously viewed to the right and in the lower direction from the node $A_3$, however, is $(2R+r)/2=R+r/2$. More specifically, a resistance when viewed to the right from the node $A_2$ is $(2R+r/2)$, and a resistance when viewed in the lower direction from the node $A_2$ is $(2R+r)$. Therefore, unbalance occurs such that $I_{21} \neq I_{22}$.

Similarly, a resistance when viewed to the right from the node $A_1$ is $(2R+3r/8)$, and a resistance when viewed in the lower direction from the node $A_1$ is $(2R+r)$. Therefore, $I_{11} \neq I_{12}$. A degree of the unbalance becomes worse than the relationship between the currents $I_{21}$ and $I_{22}$. The unbalance between the currents $I_{11}$ and $I_{12}$ appears as a nonlinear output when control data of the switches 1, 2, and 3 are (1,0,0), and (0,1,1).

Figure 4:
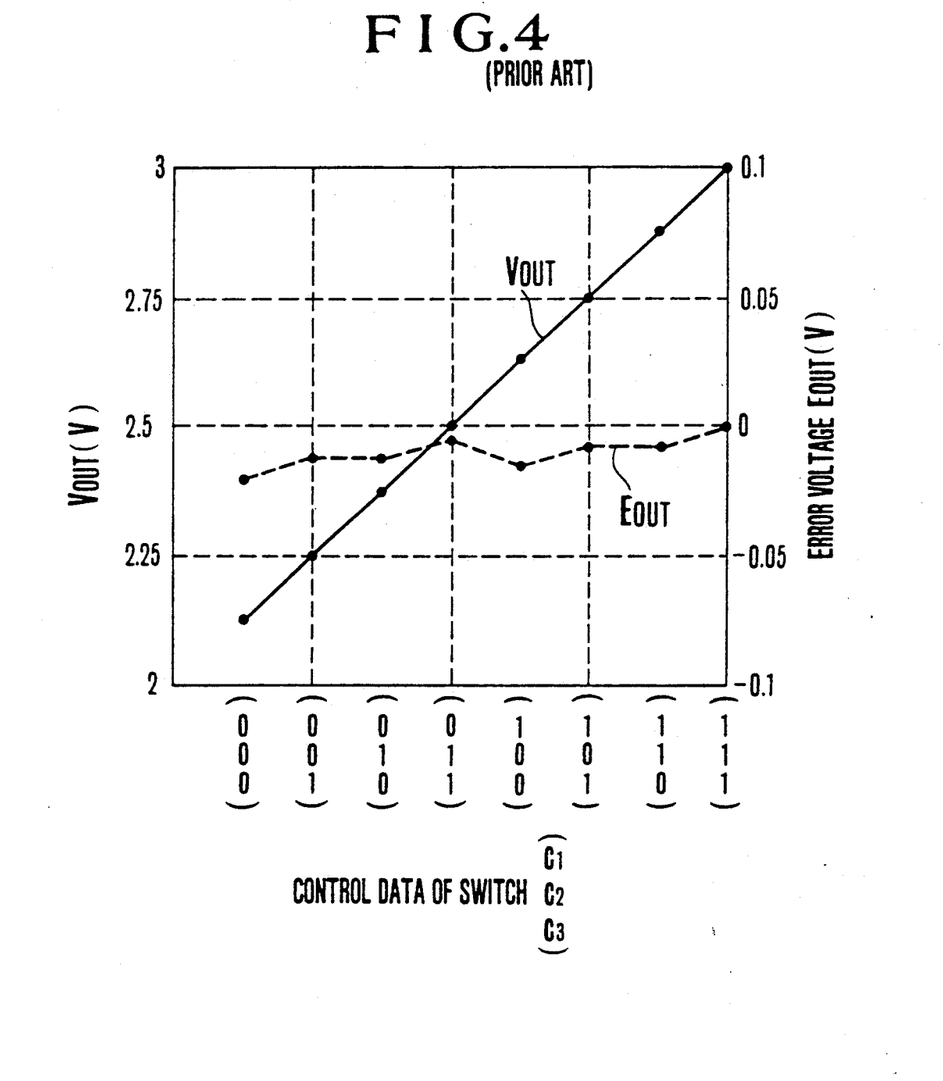
FIG. 4 is a graph showing the characteristics of the conventional 3-bit D/A converter.

FIG. 4 is a graph showing a simulation result obtained by a calculator of the output characteristics of this D/A converter. As is apparent from FIG. 4, a change in error voltage $E_{OUT}$ is increased when the control data are (0,1,1), and (1,0,0). Therefore, when the D/A converter of 3-bits or more is used, its error becomes a critical problem. In order to prevent the nonlinearity of the error voltage shown in FIG. 4, the ON resistances of the dual switches 2 and 1 must be r/2 and r/4, respectively, if the 0N resistance of the dual switch 3 in FIG. 3 is r. This means that the size of the switch is increased with a power of "2". If a D/A converter of, e.g., 8-bit is used and the size of the smallest switch is "1", the size of the largest switch must be $2^{8-1}$, i.e., 128. As a result, the same problem as that in the circuit shown in FIG. 1 is posed.

SUMMARY OF THE INVENTION

It is, therefore, a principal object of the present invention to provide a D/A converter which can improve the nonlinearity of the D/A conversion characteristics which is caused by current unbalance due to an ON resistance. and a second resistor group. The first resistor group includes several resistances and several nodes connected between first and second reference potentials. The resistances include resistances connected between the nodes and having a value which is a sum of resistances R and r and further include a last stage resistance having a value which is a sum of resistances 2R and 2r. The second resistor group includes several resistances, each having a value which is a sum of resistances 2R and r, several first terminals, and several second terminals. Each first terminal is connected to a node of the first resistor group and each resistance of the second resistor group is connected between a first terminal and a second terminal. The D/A converter further comprises an operational amplifier, first switching elements, second switching elements, and a drive circuit. The operational amplifier has inverting and non-inverting input terminals and an output terminal and is provided with a feedback circuit connected between the output and the inverting input terminals. The non-inverting input terminal of the operational amplifier is connected to the second reference potential. The first switching elements include semiconductor elements, each having an input electrode and two output electrodes. One of the output electrodes of each first switching element is connected to a corresponding one of the second terminals of the second resistor group and the other output electrode is connected to the non-inverting input terminal of the operational amplifier. Each of the first switching elements has an ON resistance r. The second switching elements also include semiconductor elements, each having an input electrode and two output electrodes. One of the output electrodes of each second switching element is connected to a corresponding one of the second terminals of said second resistor group and the other output electrode is connected to the inverting input terminal of the operational amplifier. Each of the second switching elements also has an ON resistance r. The drive circuit transmits drive signals to the input electrodes of the first and second switching elements.

According to another aspect of the present invention, there is provided a D/A converter comprising a first resistor group and a second resistor group. The first resistor group includes several resistances and several nodes connected between first and second reference potentials. The resistances include a resistance connected to a first node and having a value R, a last stage resistance having a value which is a sum of resistances 2R and 2r, and other resistances, each having a value which is a sum of the resistance R and a resistance r. The second resistor group includes several resistances, several first terminals, and several second terminals. The resistances include a resistance connected to a first node having a value 2R and other resistances, each having a value which is a sum of the resistances 2R and r. Each first terminal is connected to a node of the first resistor group and each resistance of the second resistor group is connected between a first terminal and a second terminal. The D/A converter further comprises an operational amplifier, first switching elements, second switching elements, and a drive circuit identical to those described above.

DETAILED DESCRIPTION OF THE PREFERRED EMBODIMENTS

Figure 5:
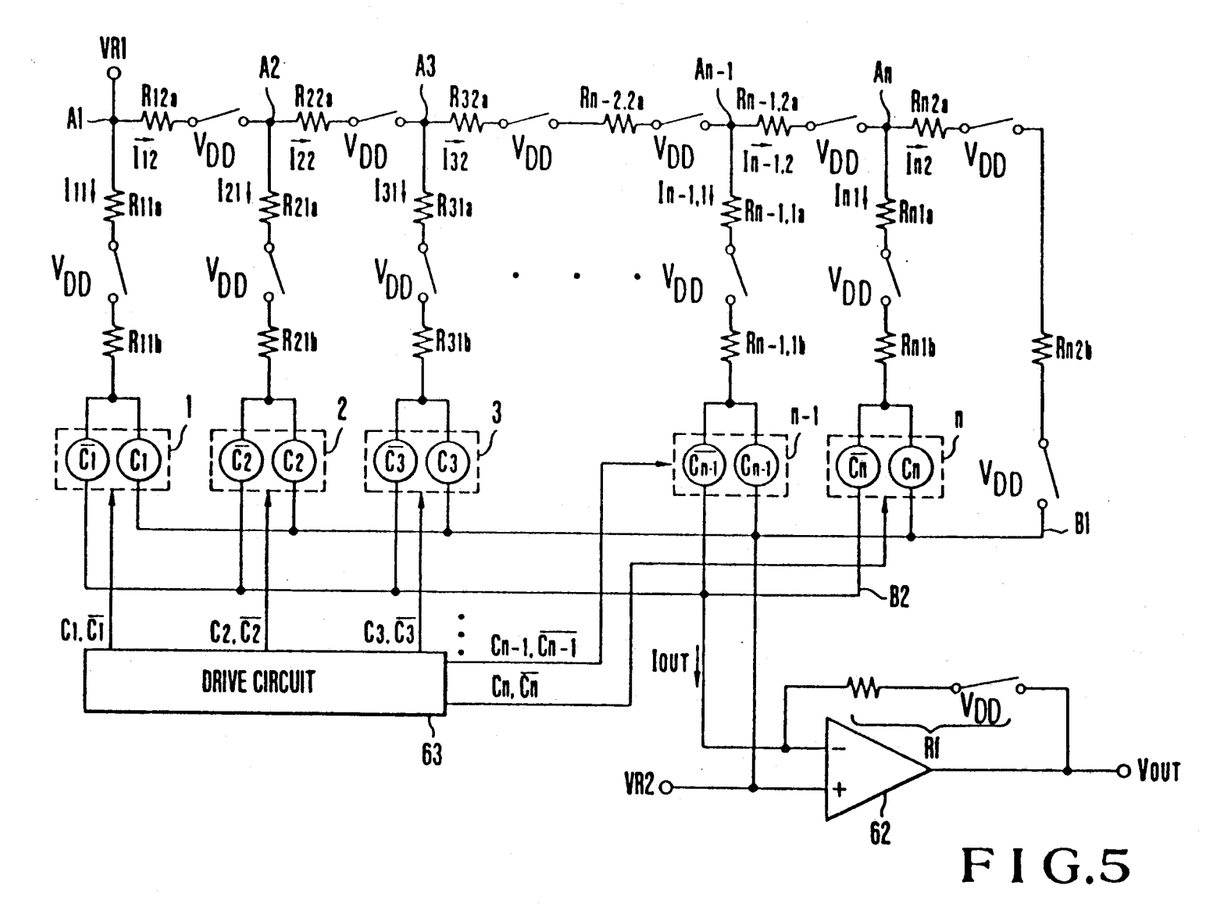
FIG. 5 is a circuit diagram of a D/A converter according to an embodiment of the present invention.

FIG. 5 is a circuit diagram of a D/A converter according to an embodiment of the present invention. The feature of this embodiment is as follows. That is, elements $R_{12a}$, $V_{DD}$, ..., $R_{n2a}$, $V_{DD}$, $R_{nb}$, $V_{DD}$ (first resistor group) are arranged between first and second reference voltages VR1 and VR2, and elements $R_{11a}$, $V_{DD}$, $R_{11b}$, ..., $R_{n1a}$, $V_{DD}$, $R_{n1b}$ (second resistor group) are respectively connected to a first node $A_1$ between the reference voltage VR1 and a first resistor in the first resistor group and nodes $A_2$ to $A_n$ of the first resistor group. In addition, an ON resistance of the switch $V_{DD}$ is equal to that of each of switches $C_1$ and $\overline{C_1}$ (first and second switching elements).

More specifically, this embodiment is provided with the switch $V_{DD}$ consisting of a MOS transistor having a resistance equal to the ON resistance of each of dual switches 1, 2, 3, ..., n consisting of the MOS transistors in order to avoid the influence of the ON resistances of the dual switches 1, 2, ..., n consisting of the MOS transistors.

Figure 6A:
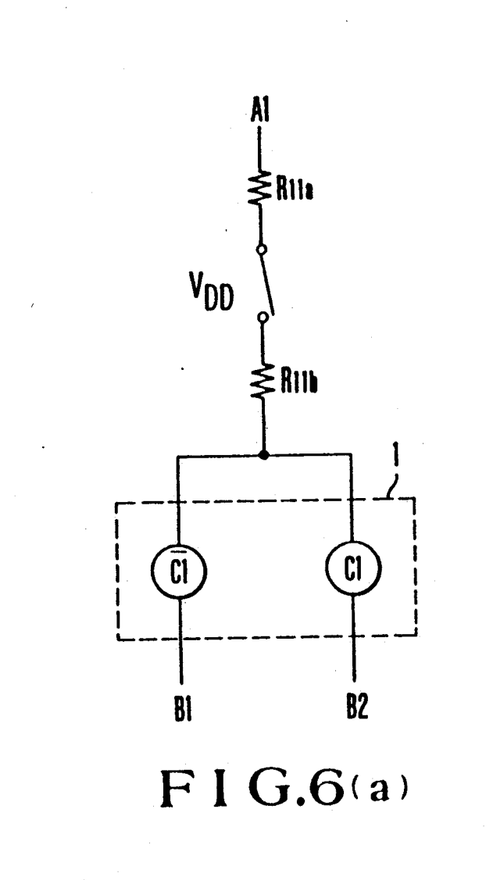
FIG. 6A is a circuit diagram showing a lower circuit with reference to a node $A_1$ in FIG. 5.
Figure 6B:
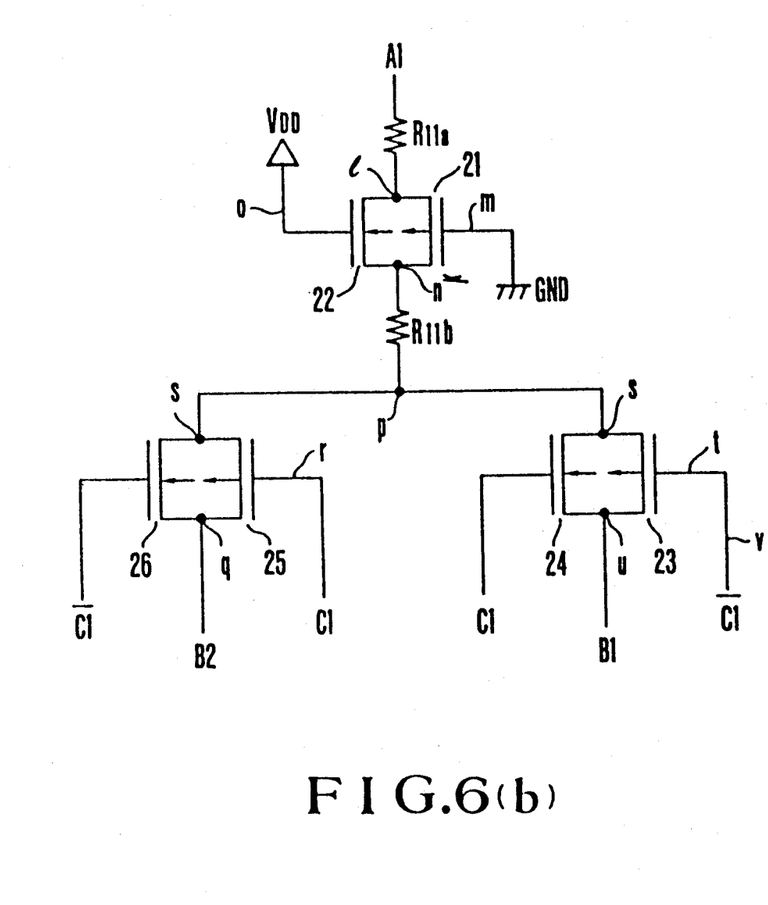
FIG. 6B is a circuit diagram showing a detailed arrangement of the circuit shown in FIG. 6A.

FIG. 6A is a circuit diagram showing a lower circuit with reference to the node A in FIG. 5, and FIG. 6B is a circuit diagram showing a detailed arrangement of the circuit shown in FIG. 6A.

As is apparent from FIGS. 6A and 6B, the switch $V_{DD}$ consists of n- and p-channel MOS transistors 21 and 22. The input electrode of the n-channel MOS transistor 22 is connected to the voltage $V_{DD}$, and the input electrode of the p-channel MOS transistor 21 is connected to GND.

Switches $C_1$ and $\overline{C_1}$ have the same arrangement as that of the switch $V_{DD}$. The input electrode of an n-channel MOS transistor 24 is connected to a signal $C_1$, and the input electrode of a p-channel MOS transistor 23 is connected to a signal $\overline{C_1}$. On the other hand, MOS transistors 25 and 26 of the switch $\overline{C_1}$ are connected to inverted signals with respect to the switch $C_1$.

Note that although only the lower circuit with reference to the node $A_1$ has been described in this case, other switches $V_{DD}$, $C_2$, $\overline{C_2}$, ..., $C_n$, $\overline{C_n}$ shown in FIG. 5 have the same arrangement.

Figure 7:
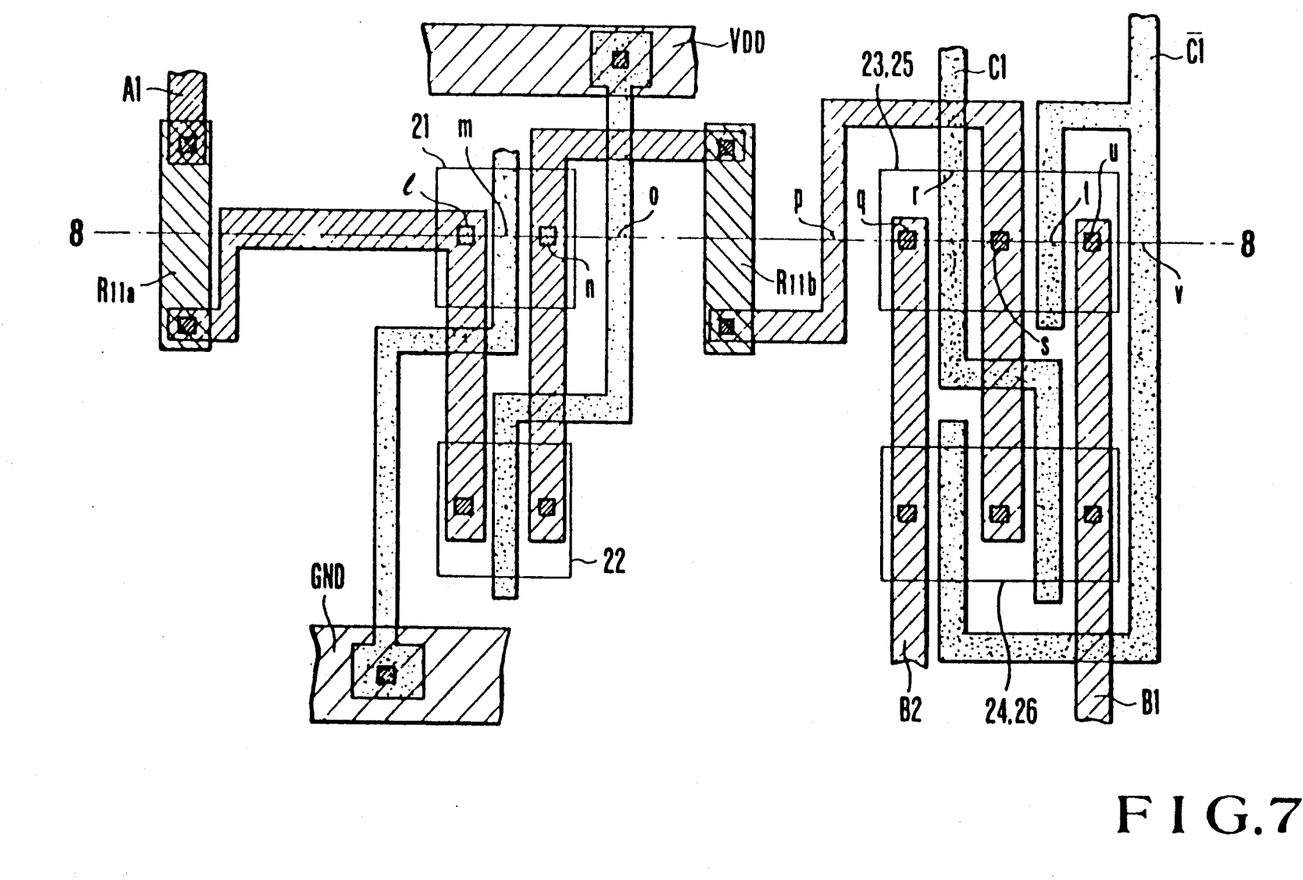
FIG. 7 is a plan view showing an integrated circuit device including the circuit shown in FIG. 6B.

FIG. 7 is a plan view showing an integrated circuit device including the circuit shown in FIG. 6B. The same reference numerals in FIG. 7 denote the same parts as in FIG. 6B. As shown in FIG. 7, the switches $V_{DD}$, $C_1$, and $\overline{C_1}$ are simultaneously formed on a single substrate to be adjacent to each other. In addition, the n- and p-channel MOS transistors constituting the switches are formed to be adjacent to each other. As described above, therefore, the ON resistance of the switch $V_{DD}$ is equal to that of each of the switches $C_1$ and $\overline{C_1}$.

Figure 8:
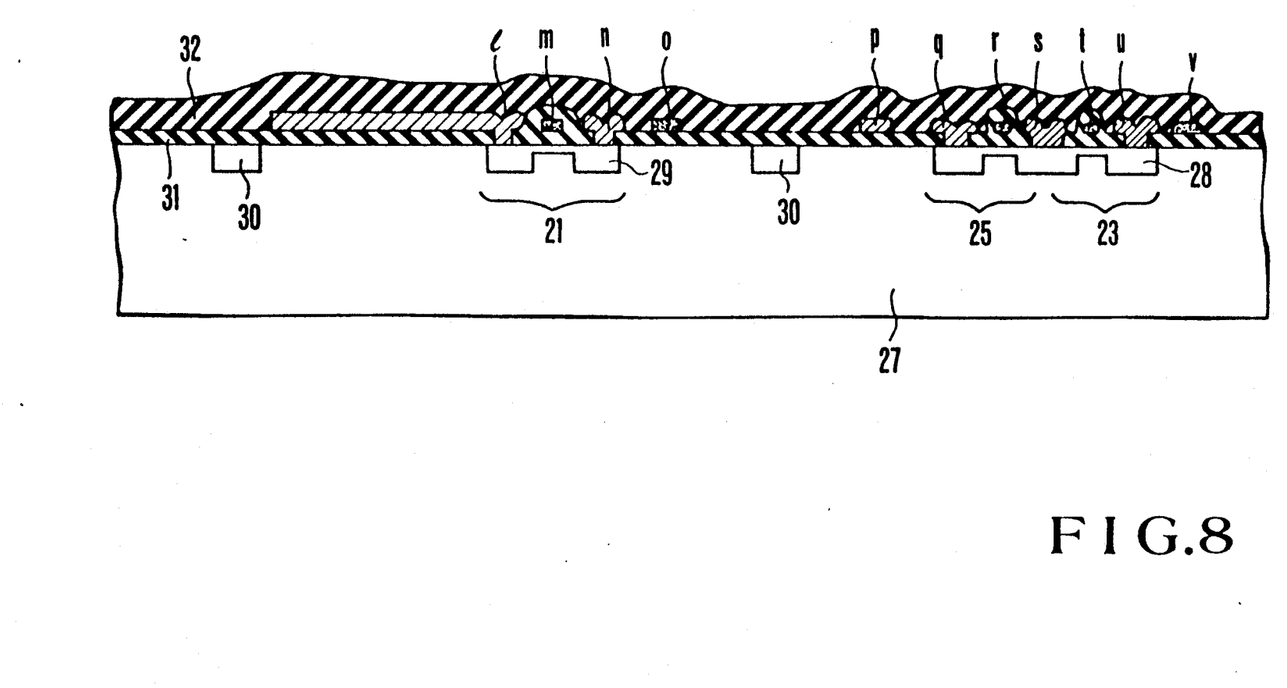
FIG. 8 is a sectional view showing the device along the line VIII—VIII in FIG. 7.

FIG. 8 is a sectional view showing the device along the line VIII—VIII in FIG. 7. Referring to FIG. 8, reference symbol l denotes one output electrode of the switch $V_{DD}$; m, an input electrode of the p channel MOS transistor 21; n, the other output electrode of the switch $V_{DD}$; o, a wiring layer of the voltage $V_{DD}$; p, a wiring layer from the resistor R to the switches $C_1$ and $\overline{C_1}$; q, one output electrode of the switch $\overline{C_1}$; r, an input electrode of the p-channel MOS transistor 25; s, an output electrode of the switches $C_1$ and $\overline{C_1}$; t, an input electrode of the p-channel MOS transistor 23; u, an output electrode of the switch $C_1$; and v, a wiring layer of the signal $C_1$;

Reference numeral 27 denotes a semiconductor substrate; 28 and 29, diffusion layers of the MOS transistors 21, 23, and 25 formed in the semiconductor substrate 27; 30, a resistance layer of the resistor R; 31, an insulating interlayer; and 32, a protective insulating film.

In the D/A converter with the above arrangement, assume that an ON resistance of the switch consisting of the MOS transistor is r. Resistances when viewed to the right and in the lower direction from the node $A_n$ in FIG. 5 are equal to each other, i.e., $(2R+2r)$. Therefore, $I_{n1}=I_{n2}$. Since a composite resistance when simultaneously viewed to the right and in the lower direction from the node $A_n$ is $(R+r)$, resistances when viewed to the right and in the lower direction are equal to each other, i.e., $(2R+2r)$. Therefore, $I_{n-1,1}=I_{n-1,2}=I_{n1}+I_{n2}=2I_{n1}$.

Similarly, $I_{11}=I_{12}$, and a value of a current is weighted with a power of "2".

More specifically, at an arbitrary node Ai, $I_{i+1,1}=I_{i+1,2}=2I_{i1}=2I_{i2}$. In addition, since a resistance (first composite resistance) when viewed to the right from the node $A_1$ and a resistance (second composite resistance) when viewed in the lower direction are $(2R+2r)$, their composite resistance is $(R+r)$. Therefore, for example, in order to set a gain of a inverted-phase amplifier using an operational amplifier 62 at "1", a feedback resistor Rf can be easily constituted by a series circuit consisting of the resistor R and the normally ON MOS switches. A feedback resistance at this time is $(R+r)$.

Figure 9:
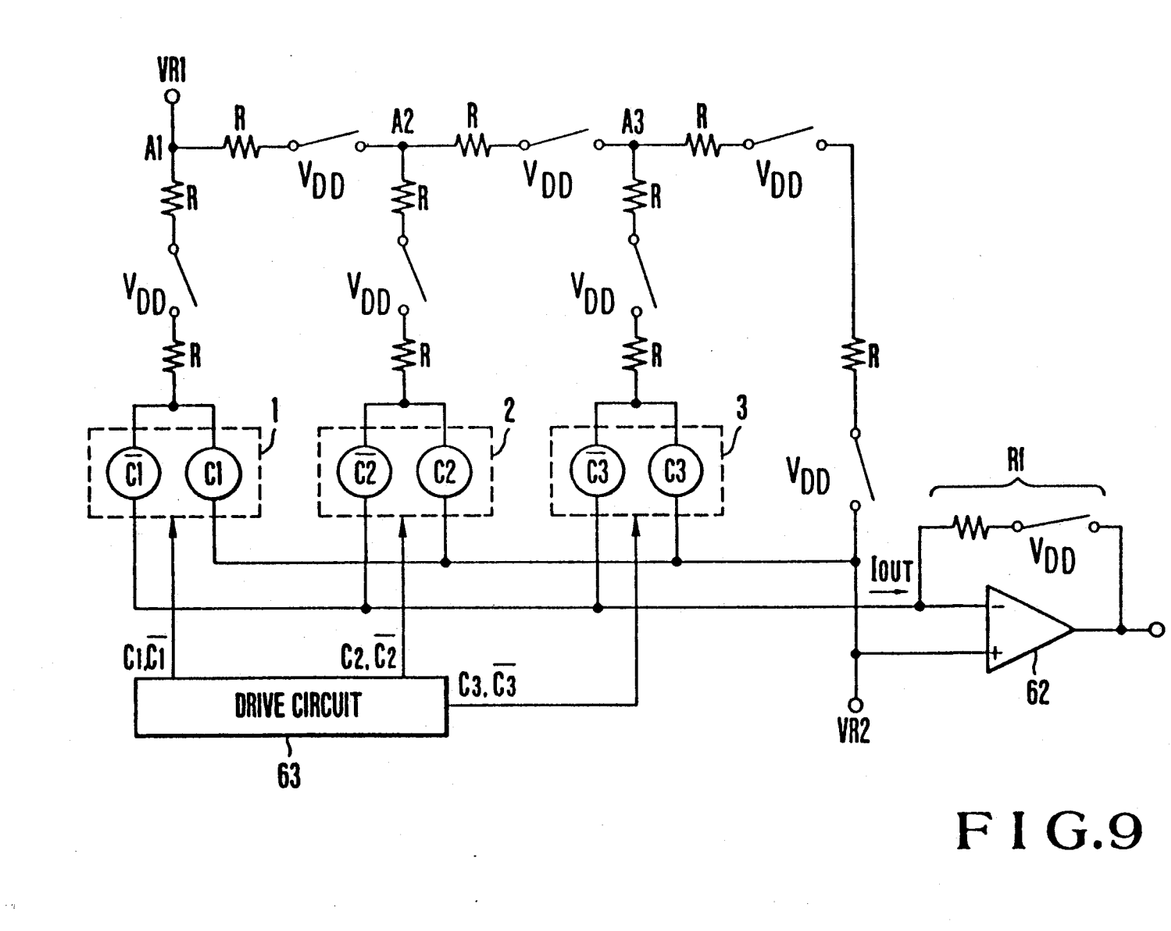
FIG. 9 is a circuit diagram showing a detailed arrangement of a 3-bit D/A converter according to the present invention.

A 3-bit D/A converter shown in FIG. 9 will be described below as a detailed arrangement.

Figure 10:
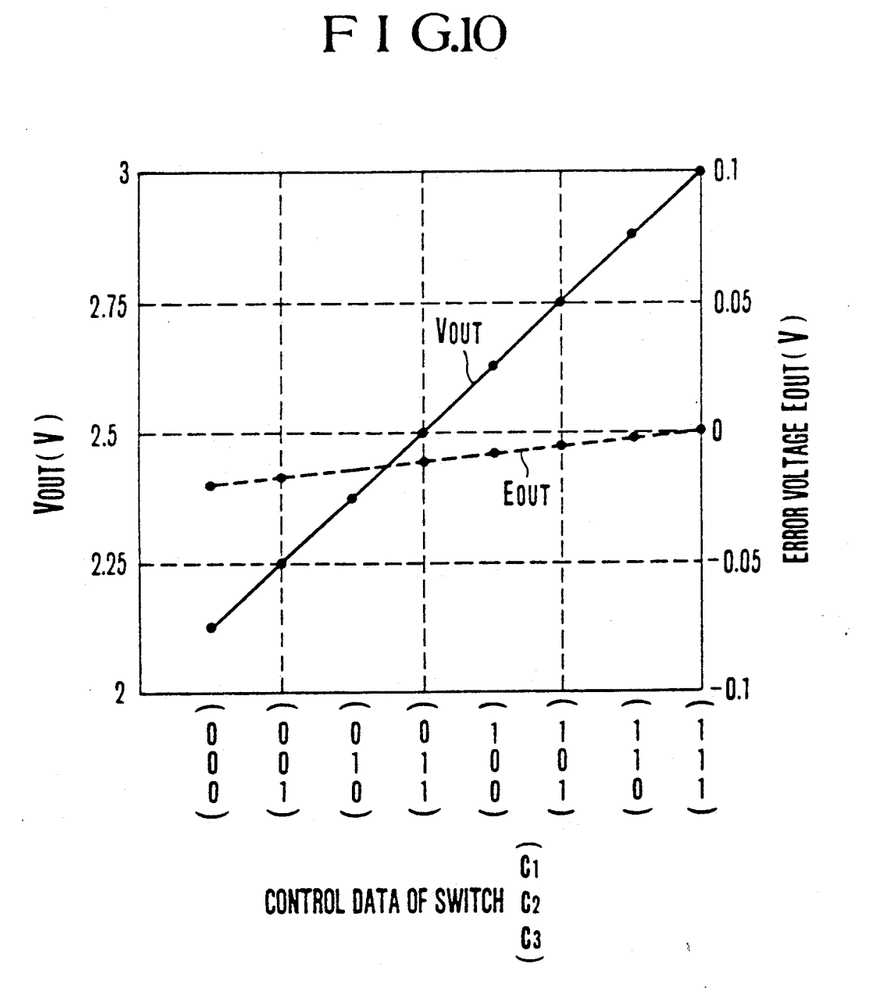
FIG. 10 is a graph showing the characteristics of the 3-bit D/A converter according to the present invention.

The characteristics of outputs and error voltages of the D/A converter with respect to the control inputs of the three dual switches are shown in FIG. 10.

The error voltage is caused by a difference in bias points of the switches 1, 2, and 3. More specifically, the switches $C_1$, $\overline{C_1}$, ..., $C_n$, $\overline{C_n}$ of an R-2R resistor ladder are arranged on a high-potential side with respect to the negative input of the operational amplifier 62. On the contrary, the feedback resistor Rf of the operational amplifier 62 is arranged on a low-potential side lower by a voltage $(r \cdot I_{OUT})$. As a result, the error voltage is caused by the difference between the bias voltages of the MOS switches.

As is understood from a graph in FIG. 10, linear characteristics are remarkably improved as compared with the characteristics of the conventional D/A converter shown in FIG. 4.

Figure 11:
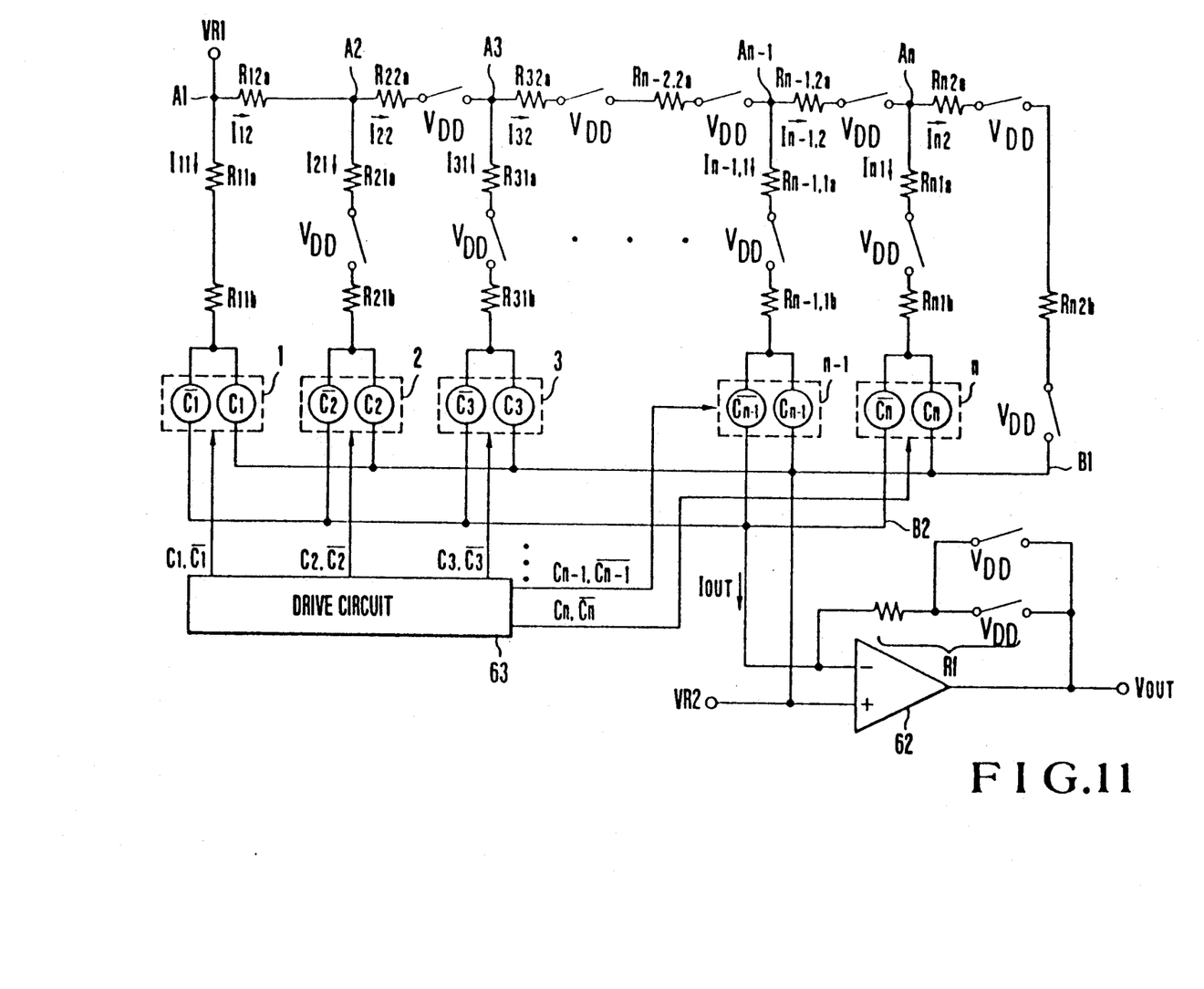
FIG. 11 is a circuit diagram showing another embodiment of the present invention.

FIG. 11 is a circuit diagram showing another embodiment of the present invention. In this embodiment, a switch $V_{DD}$ between nodes $A_1$ and $A_2$ and a switch $V_{DD}$ between the node $A_1$ and a dual switch $C_1$ are omitted, as compared with the circuit in FIG. 5. The feature of this circuit is that two switches $V_{DD}$ serving as feedback resistors Rf are connected in parallel to each other.

In this embodiment, therefore, a resistance when viewed to the right from the node $A_1$ is equal to a resistance when viewed in the lower direction from the node $A_1$, i.e., $(2R+r)$. Therefore, $I_{11}=I_{12}$. In addition, a composite resistance when simultaneously viewed to the right and in the lower direction from the node $A_1$ is $(R+r/2)$. Therefore, in this embodiment, the value of the ON resistance r can be half that of the circuit shown in FIG. 5, and the voltages $E_{OUT}$ in FIG. 10 become half. More specifically, the two switches are eliminated and another switch is arranged in parallel in the feedback circuit, so that the same effect as in the case wherein the sizes of all the switches shown in FIG. 3 are doubled and their ON resistances of r/2 can be obtained. This can be applied to an n-bit D/A converter.

Thus, the circuit of the present invention includes $R_{12a}$, $V_{DD}$, ..., $R_{n2a}$, $V_{DD}$, $R_{nb}$, $V_{DD}$ (first switching elements), and $R_{11a}$, $V_{DD}$, $R_{11b}$, ..., $R_{n1a}$, $V_{DD}$, $R_{n1b}$ (second switching elements). The resistances of the first and second resistor groups are determined so that a first composite resistance when viewed to the first resistor group from the nodes including the node $A_1$ (first node) is equal to the second composite resistance when viewed to the second resistor group. Therefore, the unbalanced current due to the ON resistances of the switching elements can be eliminated, thus effectively improving the nonlinearity of the D/A conversion characteristics.

Since the circuit of the present invention has an arrangement which can hardly be affected by the ON resistances of the switching elements, the switching elements (MOS transistors) can be made compact as compared with that of the conventional circuit. Therefore, when the D/A converter is formed in an LSI or the like, the chip size of the LSI can be effectively reduced.

What is claimed is:

1. A D/A converter comprising:
    a first resistor group including a plurality of resistances and a plurality of nodes connected between first and second reference potentials, wherein said plurality of resistances includes resistances connected between the nodes and having a value which is a sum of resistances R and r and further includes a last stage resistance having a value which is a sum of resistances 2R and 2r;
    a second resistor group including a plurality of resistances, each resistance having a value which is a sum of resistances 2R and r, and a plurality of first and second terminals, each first terminal being connected to a node of the first resistor group and each resistance of the second resistor group being connected between a first terminal and second terminal;
    an operational amplifier having inverting and non-inverting input terminals and an output terminal, said operational amplifier being provided with a feedback circuit connected between said output and inverting input terminals and said second reference potential being connected to said non-inverting input terminal of said operational amplifier;
    first switching elements including semiconductor elements, each having an input electrode and two output electrodes, one of said output electrodes of each first switching element being connected to a corresponding one of said second terminals of said second resistor group and the other output electrode being connected to said non-inverting input terminal of said operational amplifier, each of said first switching elements having an ON resistance r;
    second switching elements including semiconductor elements, each having an input electrode and two output electrodes, one of said output electrodes of each second switching element being connected to said corresponding one of said second terminals of said second resistor group and the other output electrode being connected to said inverting input terminal of said operational amplifier, each of said second switching elements having an ON resistance r; and a drive circuit for transmitting drive signals to said input electrodes of said first and second switching elements.

2. A converter according to claim 1, wherein said feedback circuit comprises a feedback resistance having a value which is a sum of the resistances R and r.

3. A converter according to claim 2, wherein the resistance R of said first and second resistor groups is realized by a fixed resistor, and the resistances r of said first and second resistor groups are realized by ON resistances of third switching elements, each including a semiconductor element which is the same as each of those of said first and second switching elements.

4. A converter according to claim 3, wherein said first, second, and third switching elements comprise MOS transistors.

5. A converter according to claim 10, wherein said feedback circuit comprises a feedback resistance having a value which is a sum of the resistance R and a resistance r/2.

6. A converter according to claim 5, wherein the resistance R of said first and second resistor groups is realized by a fixed resistor, and the resistances r of said first and second resistor groups are realized by ON resistances of third switching elements, each including of a semiconductor element which is the same as each of those of said first and second switching elements.

7. A converter according to claim 6, wherein said first, second, and third switching elements comprise MOS transistors.

8. A converter according to claim 1, wherein said D/A converter is comprises an integrated circuit formed on a single substrate.

9. A D/A converter comprising a series connection including a plurality of first resistances and a plurality of nodes between the resistances, each resistance having a value which is a sum of resistances R and r and said series connection being coupled between a first reference voltage point and a first circuit node, a plurality of second resistances, each resistance having a value which is a sum of resistances 2R and r and having first and second terminals, the first terminal being connected to a corresponding one of said nodes of said series connection, a plurality of first switches and second switches, each switch having an ON resistance r and each second terminal of the plurality of second resistances being connected to said first circuit node through a corresponding one of said first switches and to a second circuit node through a corresponding one of said second switches, an amplifier having a non-inverting input terminal connected to said first circuit node and a second reference voltage point, an inverting input terminal connected to said second circuit node, and an output terminal, a third resistance having a value which is a sum of the resistances R and r and connected between said output terminal and said inverting input terminal of said amplifier, and a switch drive circuit for driving said first and second switches in response to an input digital signal.

10. A D/A converter comprising:

a first resistor group including a plurality of resistances and a plurality of nodes connected between first and second reference potentials, wherein said plurality of resistances includes a resistance connected to a first node and a having a value R, at last stage resistance having a value which is a sum of resistances 2R and 2r, and other resistances, each having a value which is a sum of the resistance R and a resistance r;

a second resistor group including a plurality of resistances and a plurality of first and second terminals, wherein said plurality of resistances includes a resistance connected to a first node having a value 2R and other resistances, each having a value which is a sum of the resistances 2R and r, and wherein each first terminal is connected to a node of the first resistor group and each resistance of the second resistor group is connected between a first terminal and a second terminal;

an operational amplifier having inverting and non-inverting input terminals and an output terminal, said operational amplifier being provided with a feedback circuit connected between said output and inverting input terminals and said second reference potential being connected to said non-inverting input terminal of said operational amplifier;

first switching elements including semiconductor elements, each having an input electrode and two output electrodes, one of said output electrodes of each first switching element being connected to a corresponding one of said second terminals of said second resistor group and the other output electrode being connected to said non-inverting terminal of said operational amplifier, each of said first switching elements having ON resistance r;

second switching elements including semiconductor elements, each having an input electrode and two output electrodes, one of said output electrodes of each second switching element being connected to said corresponding one of said second terminals of said second resistor group and the other output electrode being connected to said inverting input terminal of said operational amplifier, each of said second switching elements having an ON resistance r; and a drive circuit for transmitting drive signals to said input electrodes of said first and second switching elements.

11. A converter according to claim 10, wherein said D/A converter comprises an integrated circuit formed on a single substrate.

* * * * *

UNITED STATES PATENT AND TRADEMARK OFFICE
CERTIFICATE OF CORRECTION

PATENT NO. : 5,119,095

DATED : June 2, 1992

INVENTOR(S) : Hiroshi Asazawa

It is certified that error appears in the above-identified patent and that said Letters Patent is hereby corrected as shown below:

Column 7, line 28, delete "of".

Column 8, line 10, delete "a" (second occurrence).

Column 8, line 10, change "at" to --a--.

Signed and Sealed this

Thirty-first Day of August, 1993

*Attest:*

BRUCE LEHMAN

*Attesting Officer*  *Commissioner of Patents and Trademarks*